(12) United States Patent
Naber

(10) Patent No.: US 9,224,906 B2
(45) Date of Patent: Dec. 29, 2015

(54) METHOD FOR MANUFACTURING A SOLAR CELL

(71) Applicant: Tempress IP B.V., Vaassen (NL)

(72) Inventor: Ronald Cornelis Gerard Naber, Apeldoorn (NL)

(73) Assignee: Tempress IP B.V., Vaassen (NL)

( * ) Notice: Subject to any disclaimer, the term of this patent is extended or adjusted under 35 U.S.C. 154(b) by 0 days.

(21) Appl. No.: 14/379,479

(22) PCT Filed: Mar. 18, 2013

(86) PCT No.: PCT/NL2013/050199
§ 371 (c)(1),
(2) Date: Aug. 18, 2014

(87) PCT Pub. No.: WO2013/141700
PCT Pub. Date: Sep. 26, 2013

(65) Prior Publication Data
US 2015/0011036 A1 Jan. 8, 2015

(30) Foreign Application Priority Data
Mar. 20, 2012 (NL) ...................................... 2008507

(51) Int. Cl.
*H01L 31/18* (2006.01)
*H01L 31/068* (2012.01)

(52) U.S. Cl.
CPC .......... *H01L 31/1876* (2013.01); *H01L 31/068* (2013.01); *H01L 31/1804* (2013.01); *Y02E 10/547* (2013.01)

(58) Field of Classification Search
CPC ................. H01L 31/1804; H01L 2924/00014; H01L 31/18; H01L 2924/00; H01L 31/068; H01L 31/022425; H01L 31/02167; H01L 31/022441
See application file for complete search history.

(56) References Cited

U.S. PATENT DOCUMENTS

| | | | |
|---|---|---|---|
| 2010/0300518 A1 | 12/2010 | Moslehi et al. | |
| 2011/0272020 A1* | 11/2011 | Biro et al. | 136/256 |
| 2013/0089942 A1* | 4/2013 | Boescke | 438/57 |

FOREIGN PATENT DOCUMENTS

| | | |
|---|---|---|
| DE | 102010003784 | 10/2011 |
| EP | 0363069 | 4/1990 |

(Continued)

OTHER PUBLICATIONS

Chen; et al. "Low resistivity high efficiency silicon solar cell for potential space application", Proceedings of the Photovoltaic Specialists Conference, Louisville, KY, May 10, 1993, pp. 1409-1414.

(Continued)

*Primary Examiner* — Tony Tran
(74) *Attorney, Agent, or Firm* — Bret E. Field; Makoto Tsunozaki; Bozicevic, Field & Francis LLP

(57) ABSTRACT

The invention relates to a method for manufacturing a solar cell from a semiconductor substrate of a first conductivity type, the semiconductor substrate having a front side and a back side, the method comprising in this sequence: creating by diffusion of a dopant of a second conductivity type a second conductivity-type doped layer in the front side and the back side, during diffusion forming of a dopant containing glassy layer on the front and back side; removing the second conductivity-type doped layer and the dopant containing glassy layer from the back side by a single sided etching process, while maintaining the dopant-containing glassy layer in the front side; creating a Back Surface Field (BSF) layer of the first conductivity type on the back side by implantation of a dopant of the first conductivity type into the back side; removing the dopant containing glassy layer from the front side of said substrate by an etching process; surface oxidation by heating said substrate for a predetermined period of time and to a predetermined temperature in oxidizing atmosphere to form passivation layers on the front side and the back side.

20 Claims, 10 Drawing Sheets

(56) References Cited

FOREIGN PATENT DOCUMENTS

| WO | 2009064183 | 5/2009 |
| WO | 2011025371 | 3/2011 |

OTHER PUBLICATIONS

Kim; et al. "Study of the ion-implanted back-surface fields in front-contact front-junction solar cells", 2011 37th IEEE Photovoltaic Specialists Conference, Jun. 19, 2011, pp. 1933-1936.

Kreinin; et al. "Comparison of Different Technologies for Bifacial Silicon Based Solar Cells", The Compiled State-of-the-Art of PV Solar Technology and Deployment, 22nd European Photovoltaic Solar Energy Conference, Milan, Italy, Sep. 3, 2007, pp. 1665-1668.

Kuznicki; et al. "Aluminum-BSF Profile Realized by Diffusion, Implantation and Thermal Annealing", 14th E. C. Photovoltaic Solar Energy Conference, Barcelona, Spain, Jun. 30, 1997, pp. 164-167.

Pelletier; et al. "Plasma-based ion implantation and deposition: a review of physics, technology and applications", IEEE Transactions on Plasma Science, vol. 33, No. 6, (2005), 1-72.

\* cited by examiner

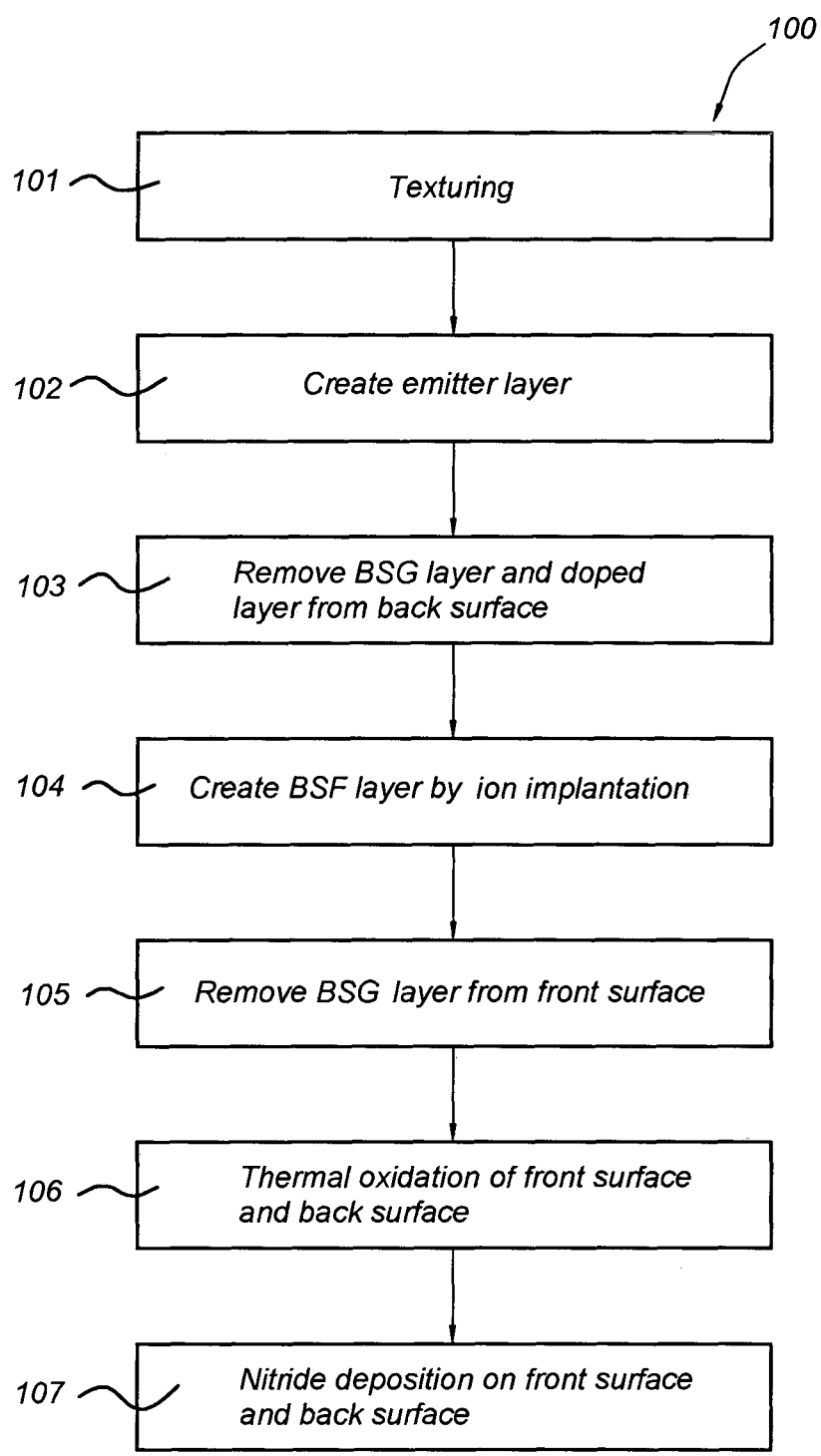

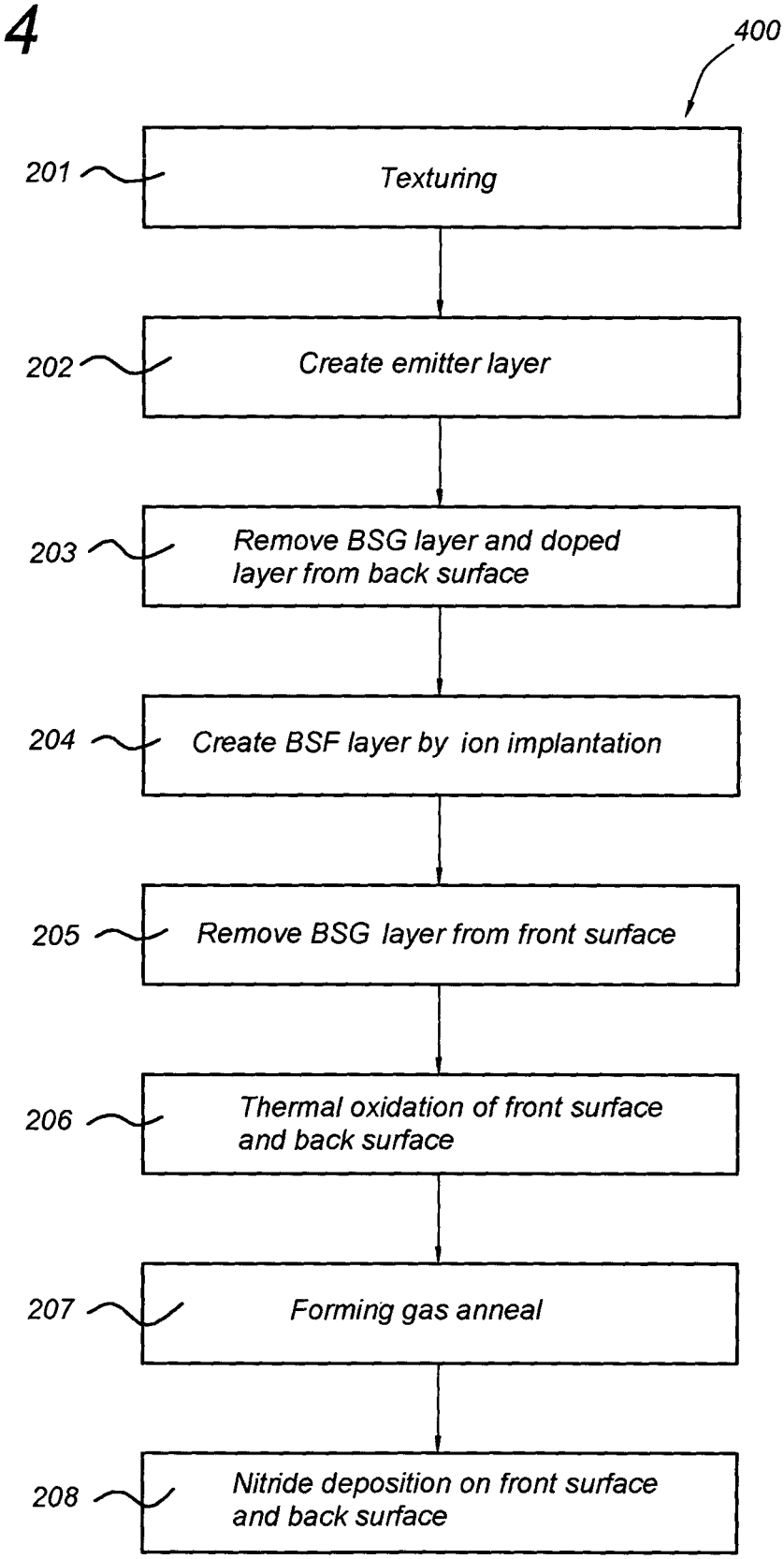

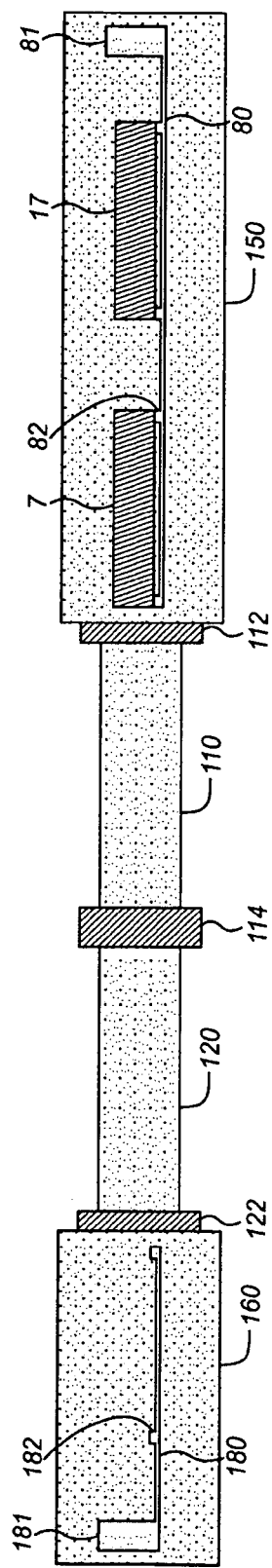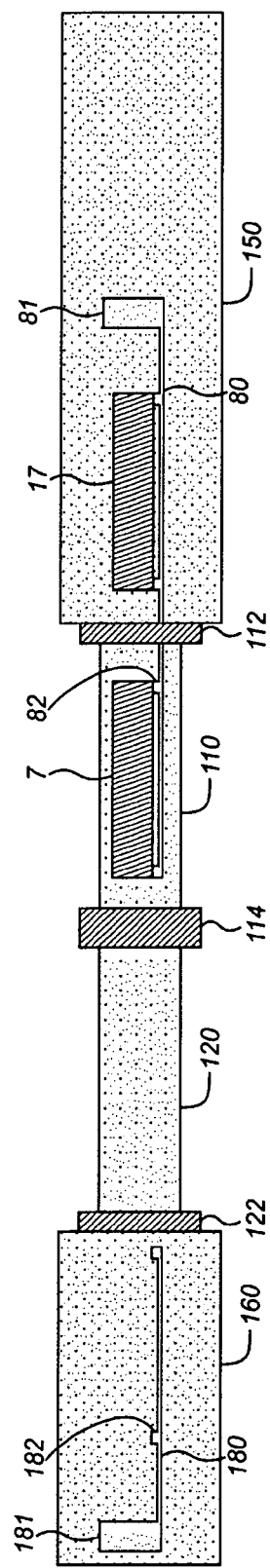

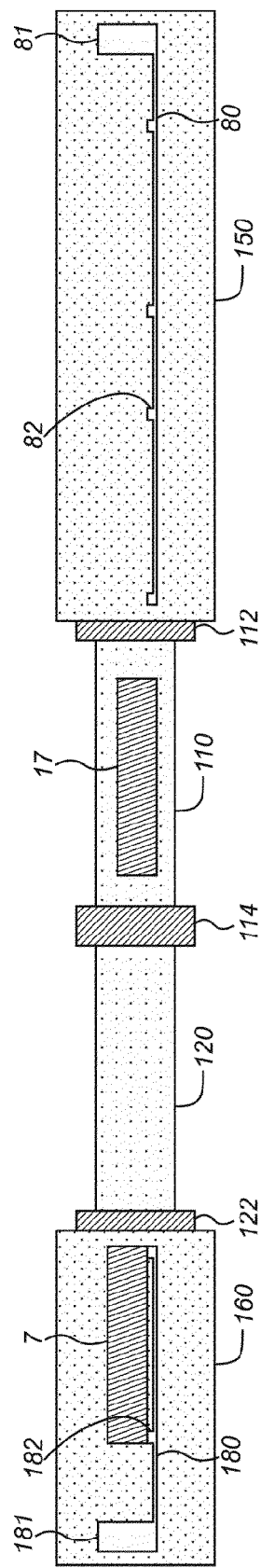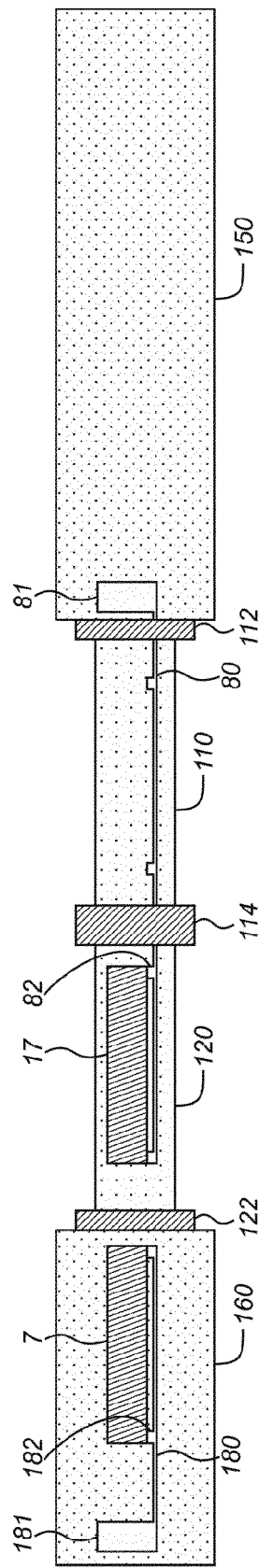

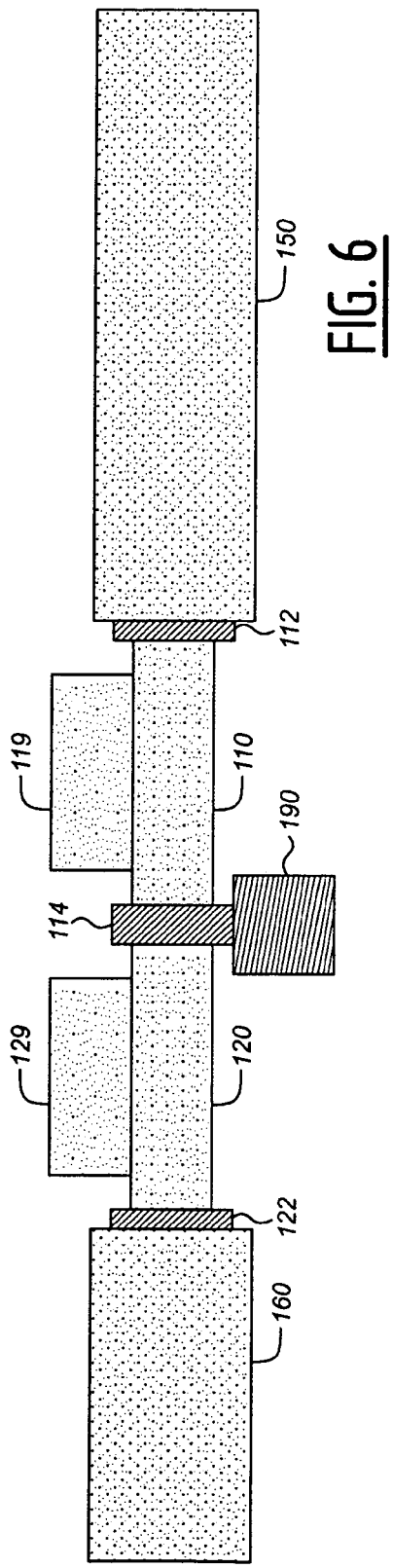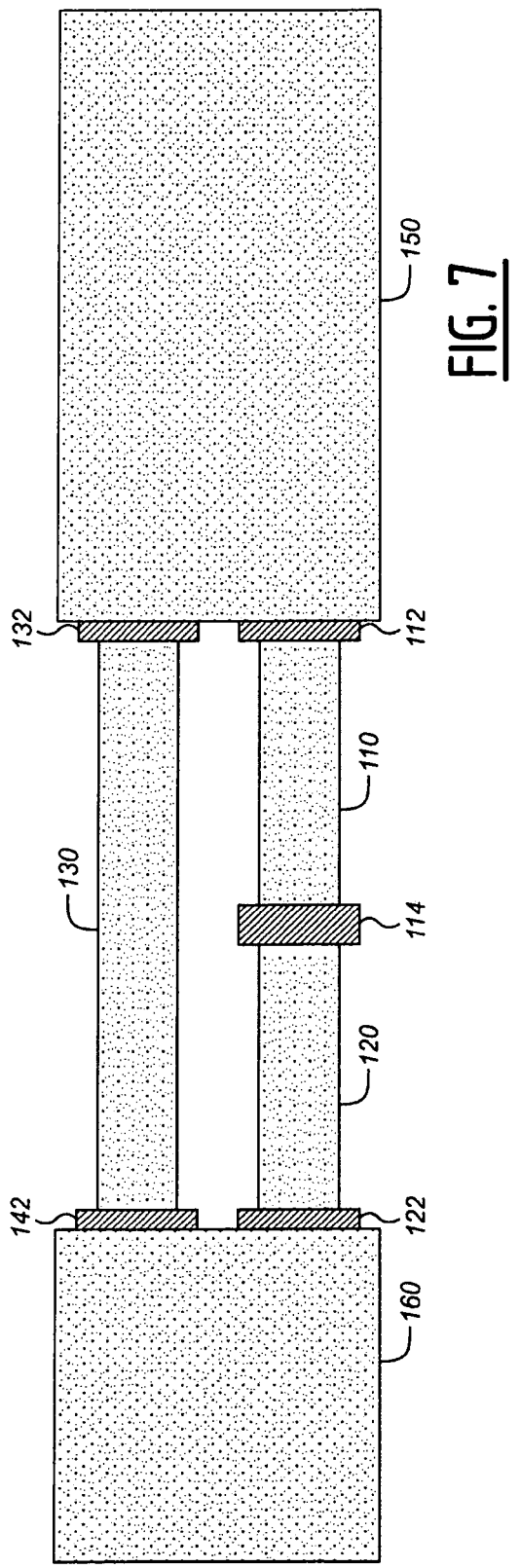

METHOD FOR MANUFACTURING A SOLAR CELL

FIELD

The present invention relates to a method for manufacturing a solar cell.

BACKGROUND

The invention relates to a solar cell with p- or n-type base. The solar cell comprises a semiconductor substrate, e.g. silicon, which is covered on a back side by the p- or n type back surface field (BSF) layer and on a front side by an emitter layer of a conductivity type opposite to that of the base layer. The front side of the substrate is arranged to be directed towards a light source during use of the solar cell.

Document WO 2009/064183 discloses a process for creating of a n-type BSF layer and a p-type emitter in a silicon substrate comprising: providing a crystalline substrate having a first side and a second side opposite the first side, pre-diffusing Phosphorus into said first side of the substrate, blocking said first side of said substrate, diffusing Boron into said second side of said substrate and simultaneously diffuse said Phosphorus further into the substrate. That document further discloses that the first side can be blocked using the first side of another substrate. Thus, that document discloses that it is possible to form a solar cell structure by diffusing Boron onto substrates with a pre-existing BSF layer if the BSF layer is protected, for example, by placing the back sides of two substrates against each other ('back-to-back' loading).

Document WO 2011/025371 discloses a process for creating a p- or n-type BSF layer and an n- or p-type emitter in a silicon substrate. This process comprises the step of diffusing a dopant on both the textured front side and the back side of the silicon substrate. Subsequently, the resulting glassy layers are removed from both sides, and the doped layer on the front side is removed and replaced in a diffusion process through a doped layer of the opposite conductivity type. The gist of this process is that a co-diffusion of the emitter on the frontside and the BSF on the backside is feasible in combination with a non-single sided diffusion to pre-diffuse the BSF layer. The requirement thereto is that the frontside is etched before the co-diffusion, which can be done in a way that retains the existing surface texture. The two-sided diffusion of the BSF layer may be carried out in a variety of doping methods, including the use of a belt furnace and diffusion sources applied by spray, vapour, spinning, printing or plasma implantation doping.

A disadvantage of the known manufacturing process is that an emitter with a high sheet resistance will have a lower junction depth, which brings the junction closer to a front side metal contact which may increase recombination losses and reduces cell efficiency.

A further disadvantage of the known manufacturing process is that removing the first conductivity-type doped layer from the textured front surface by an etching process adapted for retaining texture of the textured front surface is a critical process. Over-etching on the front side leads to enhanced optical losses due to the loss of the surface texture. Under-etching would lead to shunting problems because the remaining first conductivity-type doped layer can compensate the subsequently diffused second conductivity-type doped layer. The critical nature of the front side etching process may cause some yield losses in high-volume solar cell production.

SUMMARY OF THE INVENTION

It is an object of the present invention to provide a method for manufacturing the solar cell with p- or n-type base, which overcomes or reduces the disadvantages as mentioned above.

According to the invention this object is achieved by a method for manufacturing a solar cell from a semiconductor substrate of a first conductivity type, the semiconductor substrate having a front side and a back side, the method comprising in a sequence: creating by diffusion of a dopant of a second conductivity type a second conductivity-type doped layer in the front side and the back side; during diffusion forming of a dopant containing glassy layer on the front and back side; removing the second conductivity-type doped layer and the dopant containing glassy layer from the back side by a single sided etching process, while maintaining the dopant containing glassy layer on the front side; creating a Back Surface Field (BSF) layer of the first conductivity type on the back side by implantation of a dopant of the first conductivity type into the back side; removing the dopant containing glassy layer from the front side of said substrate by an etching process; and surface oxidation by heating said substrate for a predetermined period of time and to a predetermined temperature in oxidizing atmosphere to form passivation layers on the front and the back side.

The inventors of the present invention have realized that the co-diffusion step for the BSF of the known process is actually undesired. The double diffusion step of the BSF layer will result in dopant drive-in into the substrate and out-diffusion out of the substrate, reducing the dopant concentration at the back surface. This is undesired in order to make a good contact with a metallization to be deposited thereon. Furthermore, the co-diffusion leads to a physical connection between the BSF and the emitter at the edges of the substrate. This creates the need for an additional process step that establishes an isolation between the front side emitter layer and the BSF layer. A commonly used process to establish such an isolation is to make a groove by laser on the front side near the edges of the wafers, but it comes at the cost of a reduced cell efficiency as the laser groove lowers the effective solar cell area and because the damaged silicon surface inside the groove may be associated with a high electron-hole recombination probability. These disadvantages add up to the difficulty in forming an adequate emitter with high sheet resistance.

The invention is based on the insight that the dopant at the textured front side, rather than the dopant in the BSF, should be given a double heat treatment so as to obtain a double diffusion. The separate emitter drive-in of the dopant of the second conductivity provides flexibility to select a deeper junction and to combine the junction with a higher sheet resistance or a lower total dopant density.

For the provision of the BSF, ion implantation can be used. This has the advantage that the implantation step will not affect the front side doping. Preferably, the implantation is carried out using directional ion beams. This ensures that merely the rear side will be attacked by the beams with their directional nature. Moreover, shunting at the substrate edges is easily prevented, without a need for plasma etching and/or laser grooving. Furthermore, The combination of diffusion and ion implantation would appear to make solar cell processing more complex. First of all, it requires a thermal oxidation step subsequent to the implantation, that would give rise to changes in the doping profile. Secondly, implantation requires exposure of one side of the substrate to a implantation source, and thus a one by one processing of substrates, rather than the stacking in boats typically used for diffusion processes. Not only is one by one processing more expensive, but also does this not fit with the handling in solar cell manufacture.

The inventors have understood that these considerations need not to apply. Rather, a thermal oxidation after a diffusion may be used for obtaining a deep junction depth of the emitter. This may be achieved even without loss of the high sheet resistance. In the context of the present application, high sheet resistance is suitably a sheet resistance within a range of 60-150 Ohm/sq, preferably 80-120 Ohm/sq. Deep junction depths can be in the range of 0.4-1 micrometer. In a preferred embodiment, the thermal oxidation is carried out so as to obtain a deep junction in the semiconductor substrate adjacent to the front side. A thermal budget sufficient to achieve such deep diffusion is thereto defined. This budget depends on temperature and duration, with a minimum duration decreasing with increasing temperature. A suitable budget is for instance based on a threatment at 900° C., for 15-40 minutes, for instance 30 minutes. Skilled persons may recalculate this budget to other temperatures, and could furthermore carry out calibration experiments. The deep junction, more particularly a buried emitter, for instance of Boron, is suitably contacted with a metal past diffusing into the semiconductor substrate. Alternatively, use may be made of any electroconductive deposition techniques, such as electroplating.

In one suitable embodiment, the dopant containing glassy layer on the front side is used as a protective carrier layer during the implantation of dopant into the back side. Unexpectedly, the handling issues may be solved in that the dopant containing glassy layer on the front side is used as a protective substrate, i.e. carrier layer, during the implantation step and any related wafer handling. This dopant containing glassy layer on the front side turns out to protect the integrity of the underlying emitter layer during the wafer handling required for the ion implantation process step. This use of the glassy layer as a protective layer significantly simplifies wafer (i.e. substrate) handling.

In this way a robust and economic manufacturing process can be obtained wherein a solar cell can be produced. Herein, a critical single-side etching step applied onto the front side of the substrates is effectively avoided. Instead, the process uses the single-side etching step applied onto the back side of the substrates, which process is intrinsically a far more robust process, because overetching on the back side does not negatively affect the solar cell efficiency.

In an embodiment, the method further comprises during the diffusion of the dopant of the second conductivity type, formation of a dopant containing glassy layer on the front side and the back side from a precursor of the second conductivity type, the dopant containing glassy layer acting as dopant source for the semiconductor substrate.

In an embodiment, the method further comprising positioning of two substrates back to back in a slot of a carrier before the diffusion of the dopant of the second conductivity type. Placing the substrates repeatedly back-to-back in the slots of the carrier increases production throughput.

More generally, the implantation is preferably carried out for several substrates simultaneously. It has been found that one may suitably achieve this, with a suitable carrier. In a further embodiment, the substrates are provided,—after their processing in an oven for the diffusion step, suitably on a carrier such as a boat, onto a holding device, which merely makes contacts to the protective layer on the front side. The holding device is thereafter moved to subsequent tools, so as to remove the dopant containing glassy layer from the back side and to implant dopant ions at the back side. The holding device could be a transport band. Alternatively, the holding device could be a chuck, wherein the substrate is kept on the holding device by means of an underpressure. The surface of such a chuck may be provided with a textured surface, complementary in shape to the textured surface of the textured face of the semiconductor substrate. The advantage of using a chuck or like holding device is that the substrate may continue to be present thereon while being processed for removal of the glassy layer and/or the implantation of dopant ions.

In an embodiment, method comprises removing the dopant containing glassy layer from the back side preceding the removal of the second conductivity-type doped layer from the back side.

In an embodiment, the method comprises removing the dopant containing glassy layer from the back side while removing the second conductivity-type doped layer from the back side, in a single sided etching process. The single side etching step for removing the second conductivity-type doped layer and the dopant containing glassy layer provides a robust process, for example, a slight over etching will not lower the short-circuit current of the solar cell.

In an embodiment the method comprises forming a layer of silicon nitride on the front and back side using plasma-enhanced chemical vapor deposition (PECVD) or low pressure chemical vapour deposition (LPCVD).

In an embodiment of the method, the etching process for removing the dopant containing glassy layer on the front side comprises a dry hydrogen fluoride (HF) vapor process. The dry HF vapor process can avoid one wet processing step to remove the second-conductivity glassy layer. This dry process reduces water consumption. A further advantage is that in case a carrier or wafer boat is used to carry the wafers for the dry HF process, the wafer boat can remain permanently in a production tool for subsequent process steps for example thermal oxidation, forming gas anneal, and LPCVD nitride deposition.

In an embodiment the method comprises forming of a gas anneal on the front and back side by exposing the substrate in an inert ambient to hydrogen H2 at an elevated temperature, such as 300-500° C. Suitably, the step is carried out prior to the LPCVD nitride deposition.

In an embodiment the method comprises forming respective layers of silicon nitride on the front side and the back side using LPCVD. An advantage of LPCVD is that it enables simultaneous deposition of a silicon nitride layer on the front- and back side of the substrate. Furthermore, LPCVD proved a dense nitride which can advantageously be used for electrochemical plating of metal contacts. The dense nature of the nitride protects the underlying silicon from metal contamination, which may otherwise adversely affect the solar cell efficiency.

A further embodiment of the method comprises positioning the substrate in a carrier; retaining the substrate in the carrier during a plurality of subsequent process steps for:
  Preferably, removing the dopant containing glassy layer on the front side by a dry hydrogen fluoride (HF) vapor process;
  surface oxidation by heating said substrate for a predetermined period of time and to a predetermined temperature in oxidizing atmosphere to form passivation layers on the front and the back side;
  optionally forming of a gas anneal on the front and back side by exposing the substrate in an inert ambient to hydrogen (H2), and
  forming respective layers of silicon nitride on the front side and the back side using LPCVD.

In this way the substrate remains in the single carrier, for example, the wafer boat during these process steps and the wafer boat can remain in the same production tool. So, handling of the substrate can be reduced which improves the process yield.

The substrates preferably remain on the same carrier starting from the dry etching step up to the LPCVD deposition. For practical reasons of apparatus design, it may be that only the surface oxidation and the nitride formation step are combined. The advantage is then that there is no need for intermediate cooling down. This saves significant time and energy. Moreover, it may well reduce the loss of surface passivation due to hydrogen loss, which may turn out to be sensitive to the thermal variation In a further embodiment, the implantation step is carried out with phosphorus ions. A suitable implant dose is for instance in the range of $10^{15}$-$10^{16}$ cm$^{-2}$, such as 2-8 $10^{15}$ cm$^{-2}$. Preferably use is made of a type of implantation apparatus known as a High current implanter. More preferably, the apparatus is suitable for a high throughput, for instance 1500-2000 substrates of standard size (6-inch) per hour. Such an apparatus is more suitably provided with a ion beam in a shape that covers more than one substrate simultaneously. The shape is more preferably rectangular, such that a plurality of substrates, for instance in the range of 4-16 can be implanted simultaneously.

In a further implementation, the implanter is provided with handling means that allow for one-sided contact. More particularly, the contact would be at the front side of the substrate that is covered with the doped glassy layer acting as a protective layer. The back side is then exposed to the implanting source, and particularly there is no risk of such contamination of the back surface that could block or deviate any ion beams originating from the implanting source.

The solar cells resulting from the present method may be any suitable type of solar cells, including conventional one-sided cells, bifacial cells. The solar cells may be provided with through-substrate via holes for contacts of the emitter to the back side. Alternatively, such can be made of an H-type metallisation. In again a further embodiment, the cells may be provided with an interdigitated back contact (IBC) cell design, as known per se to the skilled person.

According to again a further aspect of the invention, a method is provided for the manufacture of a solar cell, comprising the steps of:

positioning a semiconductor substrate with a front side and a back side in a carrier, which semiconductor substrate is provided with a doped layer and a dopant containing glassy layer on the front side;

retaining the substrate in the carrier within a single production tool during a plurality of subsequent process steps comprising:

removing the dopant containing glassy layer in a dry etching process surface oxidation by heating said substrate for a predetermined period of time and to a predetermined temperature in oxidizing atmosphere to form passivation layers on the front and the back side; and forming respective layers of silicon nitride on the front side and the back side using low-pressure chemical vapour deposition (LPCVD), and Removing the substrate out of the production tool In this way the substrate remains in the single carrier, for example, the wafer boat during these process steps and the wafer boat can remain in the same production tool. So, handling of the substrate can be reduced which improves the process yield.

Suitably, the plurality of subsequent process steps further comprises the step of forming of a gas anneal on the front and back side by exposing the substrate in an inert ambient to hydrogen H2. This step is most suitably carried out prior to the LPCVD deposition of a silicon nitride. This anneal step is suitable so as to form a nitride with good characteristics, particularly good passivation characteristics.

The dry etching step may be carried out with any suitable chemicals, for instance hydrogen fluoride (HF) is suitable for selective removal of a glassy layer of borosilicate glass (BSG) or a phosphosilicate glass (PSG).

The carrier within the single production tool is more precisely a boat, such as a boat of quartz, as known to the skilled person. During the process, the boat may be shifted from one portion of the tool to a subsequent one. An advantage hereof, particularly for the transfer of the boat from the oxidation furnace into the LPCVD reactor is that the boat can remain at elevated temperature, for instance in the range of 600-800° C. This reduces overall processing time, and appears to lead to less side-effects.

Particularly, it is believed that loss of surface passivation due to hydrogen loss at the surface of oxygen/silicon may be reduced.

The transfer of the wafer boats is suitably done in an automated manner, for instance by transmission of the wafer boat along a rail system. The production tool is more suitably of the horizontal type, so as to allow easy migration of the wafer boats between its individual units. The invention further relates to a production tool comprising An oven unit for surface oxidation by heating said substrate for a predetermined period of time and to a predetermined temperature in oxidizing atmosphere to form passivation layers on the front and the back side; and A deposition unit for forming respective layers of silicon nitride on the front side and the back side using low-pressure chemical vapour deposition (LPCVD), and Means for transport of a carrier with semiconductor substrates between said units.

This apparatus or production tool is feasible to prevent a cooling down and heating up cycle for the transfer of a wafer boat from the oven unit into the deposition unit. More suitably, a sluice is present between said deposition unit and said oven unit, such that the wafer boat may be transferred via the sluice from the oven unit into the deposition unit.

In a preferred embodiment, the oven unit and the deposition unit are arranged adjacent to each other, and isolated from each other by means of the sluice. More preferably, both the oven unit and the deposition unit are provided with a door or alternative entry for loading and/or unloading purposes. In this manner, a system is created wherein the wafer boat may be unloaded at a different location than the loading. Hence, loading may also be carried out simultaneously to processing and/or unloading. This results in a more efficient use of the apparatus. Thereto, the apparatus is more preferably provided with second transport means in addition to the—first—transport means. These transport means are suitably chosen to comprise paddles.

The sluice may be embodied in the form of a panel, but also in the form of a small chamber. The latter implementation appears advantageous, as it serves to isolate the deposition unit from the oven unit by means of creating a distance. Moreover, it may serve to prevent contamination and gas exchange. More particularly, the transport means, such as a paddle, used for transport of the wafer boat into the oven unit may also be used to transport the wafer boat into such chamber, and still does not enter the deposition unit. The second transport means, i.e. paddle, can then be used to transport the wafer boat from this sluice chamber into the deposition unit.

In a further implementation such a sluice chamber has a smaller cross-sectional area than the oven unit and/or the deposition unit. This not merely results in better isolation, but also allows for the gas entry and/or gas removal means at the end of the oven unit and/or the deposition unit, i.e. opposite to the doors thereof, and suitably above, below and/or adjacent to said sluice. This arrangement of gas entry and/or gas removal means is beneficial to the operation of the deposition unit.

In a further embodiment, the oven unit is of the horizontal type. This matches best with the deposition unit and a transfer between the two of them. More particularly, the oven unit and the deposition unit are each of a half-tube size. The resulting apparatus is then a full tube. This matches the arrangement and organization of cleanrooms, and further is in line with available support means, such as sizes of transport means, more particularly paddles, arrangement and organization of gas systems, control electronics and the like.

In one suitable embodiment, the apparatus further comprises a unit for removing a dopant containing glassy layer of a semiconductor substrate in a dry etching process. This unit is suitably arranged on top of or below the oven unit and the deposition unit. It is more preferably arranged so that the loading of this dry etching unit can occur from the same loading chamber as the entry into the oven unit. Thereto, suitably, such a loading chamber is provided with an elevator for shifting a loaded carrier—wafer boat—upwards and downwards. The invention further relates to the use of such an apparatus. This apparatus appears most beneficial for the production of solar cells. In addition, use of the apparatus for alternative semiconductor devices is not excluded. The term 'semiconductor device' is herein used in its broad sense for a device that is based on a semiconductor substrate and manufactured in a semiconductor clean room facility. Examples of such a semiconductor device are so-called micro-electromechanical system (MEMS) elements, resonators, sensors, diodes, integrated circuits and discrete devices. More generally, the use of the apparatus appears particularly beneficial for the deposition of an oxide and nitride stack, particularly for passivation and scratch resistance, wherein the substrates are vulnerable to thermal cycling. Examples hereof are for instance devices based on very thin substrates, MEMS elements, devices with ceramic layers.

Further embodiments are defined in the dependent claims, and are disclosed in the detailed description.

BRIEF DESCRIPTION OF DRAWINGS

Embodiments of the invention will now be described, by way of example only, with reference to the accompanying schematic drawings in which corresponding reference symbols indicate corresponding parts, and in which:

FIG. 1 shows a flow diagram of a first example of a method for manufacturing a solar cell in accordance with the invention;

FIG. 4 shows a flow diagram of a second example of a method for manufacturing a solar cell in accordance with the invention.

FIG. 5A-H shows a series of diagrammatical cross-sectional views of a first embodiment of an apparatus for use in the invention;

FIG. 6 shows a diagrammatical top view of the apparatus of FIG. 5

FIG. 7 shows a diagrammatical cross-sectional view of a second embodiment of the apparatus.

DETAILED DESCRIPTION

Figure 2A:
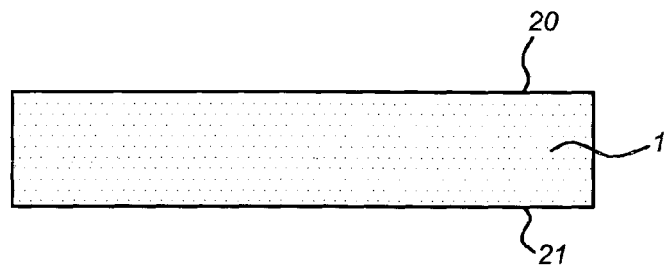
FIG. 2 shows a cross-section of a semiconductor substrate for manufacturing the solar cell.

The figures are not drawn to scale. Same reference numerals in different figures indicate the same or corresponding elements.

FIG. 1 shows a flow diagram of a first example of a method for manufacturing a solar cell in accordance with the invention. According to the first example, the method comprises a sequence 100 of processes to manufacture a solar cell with either p- or n-type base. Below, the sequence 100 is illustrated for a solar cell with n-type base. The substrate 1 of the solar cell is suitably a silicon substrate, and more preferably a monocrystalline silicon substrate 1. Alternatives thereto and variations thereof are not excluded.

FIG. 2a shows a cross-section of the silicon substrate 1 for manufacturing the solar cell. A single crystal or multi-crystalline semiconductor substrate i.e., a silicon substrate 1 with n-type conductivity is provided as precursor for the solar cell. The silicon substrate has a front side 20 and a back side 21. The front side is arranged as surface for receiving light during use of the solar cell. In an alternative embodiment, the silicon substrate is doped to have a conductivity of p-type.

Referring again to FIG. 1, next, in process 101, the method provides texturing of the surfaces 20,21 of the silicon substrate 1 by exposing the surface(s) to be textured to a texture etching agent. The front side 20 can be textured to create a surface topography (also referred to as texture features) resulting in a low reflectivity of the surface. For example, the texturing recipe can be tuned to obtain as texture features large pyramids on the surface (e.g. an average pyramid height of about 2 microns or more). The back side 21 is either textured to create a surface topography (also referred to as texture features) resulting in a low reflectivity of the surface or polished to create a surface topography resulting in a high reflectivity. The textured surface of the back side 21 does not have to be identical to the textured surface of the front side 20. It is possible to create a surface texture either in a single-sided manner on the front side 20 or in a two-sided manner on both front and back sides 20,21. Additionally, in process 101 the texturing may be combined with an etching process for saw damage removal. Combining saw damage removal and texturing may be advantageous for silicon substrates that have not been pre-polished after slicing from a silicon ingot. Alternatively, the texturing 101 may also be preceded by such an etching process for saw damage removal.

FIG. 2a show a cross-section of the solar cell after creation of texture. In the process 101 as described above, the texture is created by exposing the surface(s) to be textured to a texture etching agent. Such a texturing agent may be an alkaline or acid solution, but it could also be a plasma for dry etching.

Referring again to FIG. 1, in a subsequent process 102, the method provides the creation of a p-type (emitter) layer 3 on the textured front side. The front side is exposed at elevated temperature to a p-type dopant, for example, a boron containing gas e.g. BBr3 (boron tri bromide) in a tube furnace. The initial depth of the p-type dopant layer can be for example 0.3 micrometer. In an embodiment the substrates can be positioned in the carrier such that two substrates are repeatedly positioned back to back in a slot of the carrier before place the carrier in the tube furnace. In an embodiment the elevated temperature may be any suitable elevated temperature for the specific diffusion process being applied for the materials that are used. The elevated temperature may also depend on the time during which the elevated temperature is applied. In general the temperature applied may be between about 700 and about 1200° C. or between about 780-1200° C. During the process 102 for forming the boron doped or emitter layer 3 which is a diffusion driven process, a boron containing glassy layer (BSG) layer 2 is formed on the textured front side 20 and on the back side 21.

Figure 2B:

FIG. 2b shows a cross-section of a solar cell after forming the BSG layer 2 on the front and back side. After process step 102 to create the BSG layer, the method continues with a process step 103 to remove the BSG layer 2 and the boron doped layer 3 from the back side 21 of the substrate 1 by a single sided etch process, the BSG-layer on the front side 20 can be maintained in such a single sided etch process.

Figure 2C:
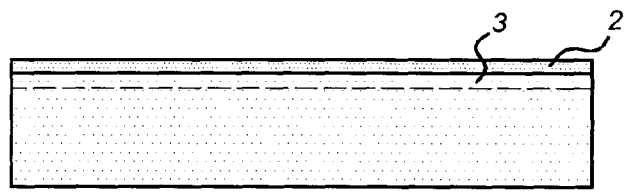

FIG. 2c shows a cross-section of a solar cell after removing the BSG layer 2 and the boron-doped layer 3 from the back side 21. In a subsequent process step 104, after removal of the BSG layer 2 and the boron doped layer 3 from the backside, the method continues with creation of a back surface field (BSF) layer 4 by ion implantation of an n-type dopant into the back side 21. The n-type dopant can be phosphorus or arsenic. The front side 20 of the substrate is not doped due to the directional character of the ion beam implantation. Furthermore, a mask can be used that shields the edge of the substrate from the ion beam to avoid doping of the edge of the substrate. In between the process steps 102, 103, 104 it is preferred to keep the BSG-layer 2 as much dry as possible in order to prevent forming of particles, which may contaminate the ion implanter.

Figure 2D:
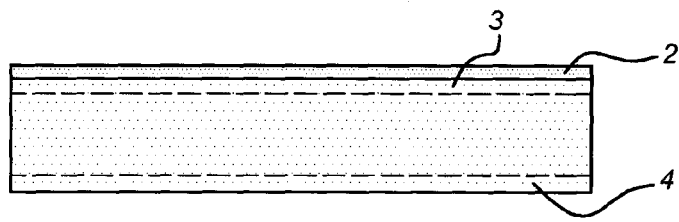

FIG. 2d shows a cross-section of the solar cell after process 104 for the creation of the BSF layer 4. In a subsequent process step 105 the method continues by removing the BSG layer 2 from the front side 20 of the substrate by an etching process. For example a dry HF etch process.

Figure 2E:
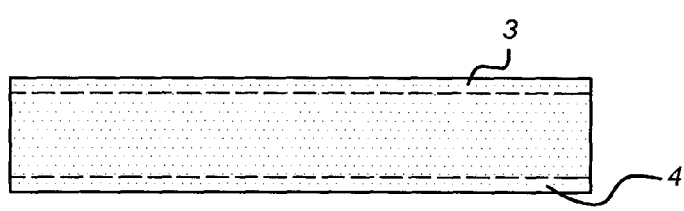

FIG. 2e shows a cross-section of a solar cell after removing the BSG layer 2 from the front side. In a subsequent process step 106, after removal of the BSG layer 2 from the front side 20, the method continues with forming a passivation layer 5 on both the front side 20 and back side 21 by heating the substrate in an oxidizing atmosphere for example 10% Oxygen O2 for a predetermined period of time, for example 0.5 hours at an elevated temperature of 1000° C.

During the oxidation a further co-diffusion of the p-doped emitter layer and the n-doped BSF is performed. It is noted that the BSF layer 4 on the back side develops further by co-diffusion, i.e., diffusion of the n-type dopant from the BSF layer deeper into the silicon substrate simultaneously with the diffusion of the p-type dopant from the emitter layer deeper into the silicon substrate on the front side. In an embodiment, after co-diffusion the BSF layer has a sheet resistance between about 20 and about 30 Ohm/square and the emitter layer has a sheet resistance between about 50 and about 70 Ohm/square. In another embodiment, after co-diffusion the BSF layer has a sheet resistance between about 5 and about 100 Ohm/square and the emitter layer has a sheet resistance between about 50 and about 150 Ohm/square.

After the sequence of processes as described above, the method provides a silicon substrate which comprises an n-type back surface field layer 4 on the back surface 21; and a p-type emitter layer 3 on the textured front side 20 and an oxide layer 5 on the n-type back surface field layer 4 and the p-type emitter layer 3 on the textured front side 20.

Figure 2F:
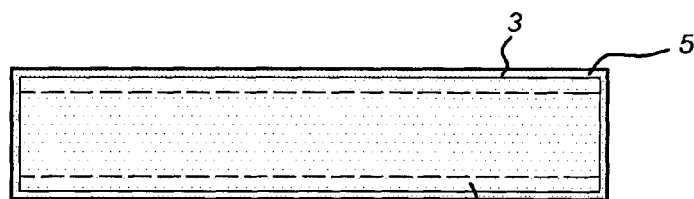

FIG. 2f shows a cross-section of a solar cell after forming the oxide layer 5 on the front and back side. After the co-diffusion in process step 106, the method continues with a subsequent process 107 to form silicon nitride (SiNx) layers 6 respectively on the front side 20 and back side 21 by PECVD.

Figure 2G:
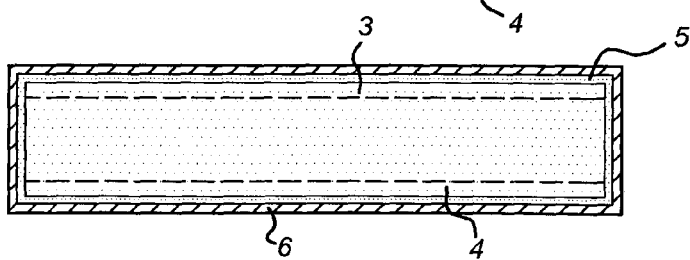
Figure 3A:
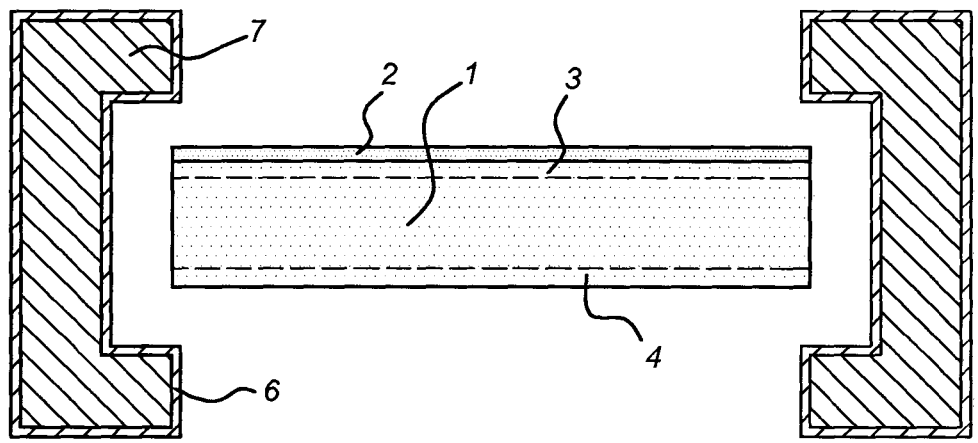
FIG. 3 shows a carrier comprising the substrate.
Figure 3B:
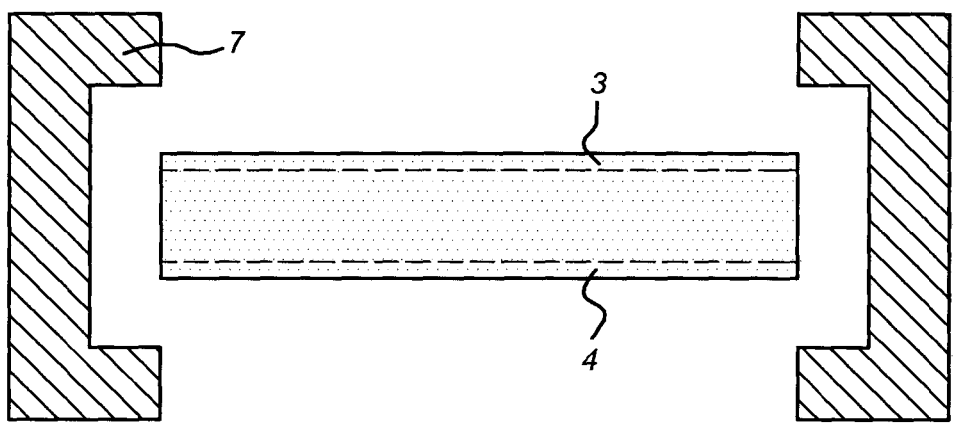
Figure 3C:
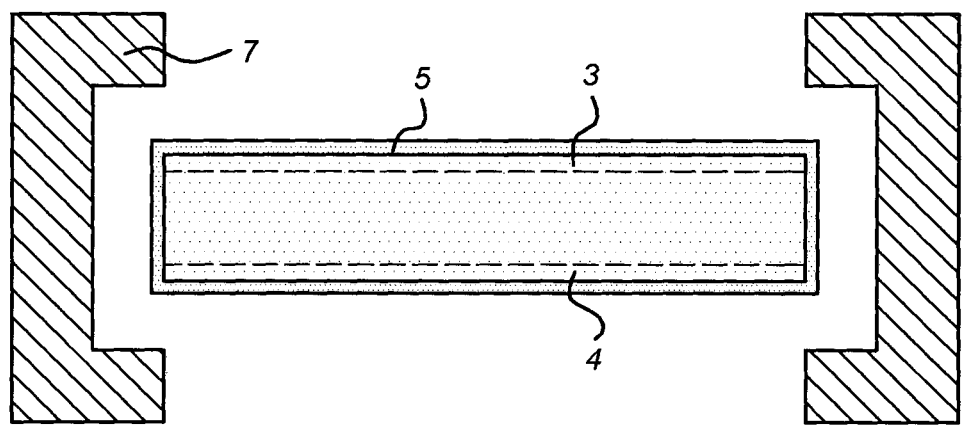
Figure 3D:
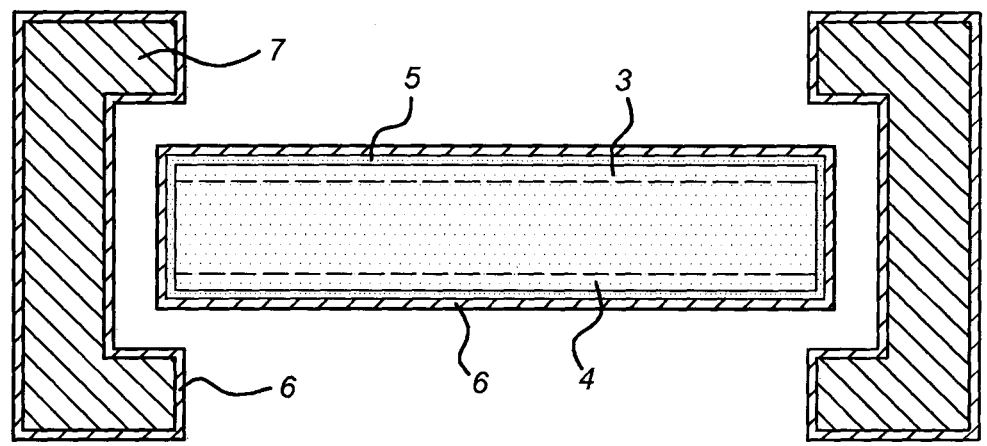

FIG. 2g shows a cross-section of a solar cell after forming the silicon nitride layer 6 on the front and back side. The solar cell manufacturing process 100 may be completed with a process for metallization for forming electrodes on the front and back side. These processes are known per see to person skilled in the art, and may comprise depositions, screen printing of metallization patterns, firing-through, etc.

FIG. 4 shows a flow diagram for a second example of a method according to the invention. The second example of the method comprises a sequence 400 of processes to manufacture a solar cell with either p- or n-type base. Below, the sequence 400 is illustrated for a solar cell with n-type base. In this second example of the method the steps 201 to 206 are identical to the steps 101-106 of the sequence 100 of the first example of the method as described above. The method 400 continues in a subsequent process step 207 after the co diffusion in process step 206, by forming a gas anneal on the front side 20 and back side 21 of the substrate 1 by exposing the substrate to an inert ambient of Nitrogen N2 and a low concentration for example 5% Hydrogen H2. The method continues with a subsequent process step 208, after forming the gas anneal on the front and the back side to form silicon nitride (SiNx) layers 6 on the front side 20 and back side 21 by LPCVD. The formation of the silicon nitride layers 6 on the front side 20 and the back side 21 can be performed simultaneously by the LPCVD process.

FIG. 2g shows a cross-section of a solar cell after forming the silicon nitride layer 6 on the front and back side. The solar cell manufacturing process 400 may be completed with a process for metallization for forming electrodes on the front and back side (not shown). These processes are known per see to the person skilled in the art, and may comprise screen printing of metallization patterns, firing-through, etc.

FIG. 3 shows a cross section of a carrier, for example, a wafer boat 7 that can be used to retain the substrate 1 in the processes 100, 400 according to the invention. For example, in process 100 the same wafer boat 7 can be used to retain the substrate permanently in the process step 105 for the removal of the BSG layer 2 and the process step 106 for forming a passivation layer 5 on the substrate 1 and in the process step 107 for forming silicon nitride layers 6 on the substrate 1. Furthermore, in process 400 the same wafer boat 7 can be used to retain the substrate permanently in the process step 205 for the removal of the BSG layer 2, in the process step 206 for forming a passivation layer 5 in the process step 207 for forming the gas anneal and in the process step 208 for forming silicon nitride layers 6 on the substrate 1. The wafer boat 7 can remain in the same production apparatus during these process steps.

FIG. 5A-H disclose in more detail a first embodiment of an apparatus in which the wafer boat 7 can remain in the same production apparatus during the steps of forming a passivation layer 5, and for forming the silicon nitride layers 6. FIG. 7 discloses a second embodiment of an apparatus, which further includes a subunit for a dry etching step, particularly for removal of the BSG layer 2, as specified with reference to FIG. 4. A subunit for performing the gas anneal, particularly known as a forming gas anneal is not included. FIG. 6 shows a diagrammatical top view indicating further elements of the apparatus.

The present apparatus as shown in FIG. 5A-H comprises an oven unit or oxidation furnace 110, deposition unit or LPCVD reactor 120, a loading chamber 150, and an unloading chamber 160. The oxidation furnace 110 is provided with a door 112 to the loading chamber 150. A connector door or sluice 114 is present between the oxidation furnace 110 and the LPCVD reactor 120, which is again provided with a door 122 to the unloading chamber. In this embodiment, both the oxidation furnace—or oven—110 and the LPCVD reactor 120 are of the horizontal type, and are designed as so-called half-tubes. A design based on full tubes is not excluded, but would require more development steps starting from LPCVD reactors and ovens as currently commercially available. The transport of the wafer boat 7, and a second wafer boat 17 through the apparatus is arranged with transport means, including paddles 80, 180. The paddle 80 is in its rest position located in the loading chamber 150, and the paddle 180 is located in its rest position in the unloading chamber 160. The paddle 80 is designed for carrying the—first—wafer boat 7 and the second boat 17. Due to its size, the paddle 80 is able to extend into the LPCVD reactor 120 through the door 112 and the sluice 114. The paddles 80, 180 are each provided with paddle movement means 81, 181 and with boat support means 82. While the paddle movement means 81, 181 are shown as an upstanding wall. However, it will be clear to the skilled person, that additional elements will be available, such as a guiding means, for instance in the form of a rail, for guiding the paddle in its movement from the loading chamber 150 into the furnace 110 (also called oven) and the LPCVD reactor 120. Furthermore, an implementation with an upstanding wall may not be necessary, and that other forms could be arranged, particularly in the—rather standard—case that the paddle 81 is driven by means of a motor. In one suitable implementation, the moving means comprise a cantilever system. Herein, a cantilever constitutes an interface between the paddle and any further boat moving means. The cantilever may be adjustable in all directions (x, y and z) and may hold different types of paddles, for instance slotted paddles. The boat support means 82 are shown in the figures in the form of a distance holder, also for sake of clarity in the figure. It will however be clear to the skilled person that such boat support means 82 may be implemented differently, and/or that these may be integrated into the paddle 80 or the boat 7, 17.

Rather than the shown implementation wherein the—first—paddle 80 extends into the LPCVD reactor 120, it is feasible that the—second—paddle 180 is designed so as to bring a wafer boat from the oven 110 into the LPCVD reactor 120, and subsequently from the LPCVD reactor 120 into the unloading chamber 160. The first paddle 80 may then be designed to be shorter than shown in the figure. In a further alternative, the system of the oven 110 and the LPCVD reactor 120 could be provided with transfer means, so as to transfer a wafer boat 7 from the oven 110 to the LPCVD reactor 120. Such transfer means could be embodied as grippers or even on the basis of a movable support for the wafer boat 7.

The substrates in the wafer boat 7 are shown in a preferred orientation relative to the oven 110 and reactor 120, i.e. transversal to the flow of gas within the oven 110 and the reactor 120. The gas flow in the oven is suitably from one side, for instance the sluice 114 to the other side, i.e. the door 112, such that the oven 110 may be subdivided into an upstream region, a wafer boat location and a downstream region. A gas entry is provided, typically with a flow control means, for entry of the said gas into the reactor in the upstream region. Gas removal means are provided in the downstream region. Suitably, the oven may be provided with means for defining an underpressure. Such means are typically coupled to the gas removal means. The same applies to the LPCVD reactor 120, as well known to the skilled person in the art of these apparatuses.

Suitably, the gas provision and removal in the system of the oven 110 and the LPCVD reactor 120 is integrated. Several stages of integration are feasible. For instance, the gas flow directions in the oven 110 and the LPCVD reactor 120 may be reversed, such that either all gas entry means may be in the center, i.e. adjacent to the sluice 114, or that all gas removal means may be present on that side. Furthermore, gas storage systems may be coupled, so as to provide a single vessel of oxygen (for instance) and/or hydrogen for supply to both the oven 110 and the LPCVD reactor 120. Heating means present in the oven 110 and the LPCVD reactor 120 may be coupled, even though the temperature settings in the oven 110 should be variable relative to those in the LPCVD reactor 120. The same holds for pressure setting means.

The loading chamber 150 and the unloading chamber 160 are in-line stations and feasible for cleanrooms, such as class 1, class 10 and class 100 cleanrooms. The chambers are in this, preferred but not essential, implementation provided with a work surface, a perforated filter screen and tube-level shelves all made of mirror polished stainless steel. Fans are available in this implementation with an adjustable rotation speed. The loading chamber 150 and unloading chamber 160 are suitably provided with systems for fully automated wafer loading and unloading from the wafer boat 7, 17. In order to meet said cleanroom requirements, the (un)loading chambers 150, 160 are regulated with a pre-filter through for instance HEPA, ULPA. The (un)loading chambers 150, 160 may be implementated with unidirectional, laminar airflow (for instance horizontal or vertical). If a dry etching unit is present above or below the oven and LPCVD reactor, such as shown in FIG. 7, an elevator is suitably present for shifting a loaded wafer boat upwards and/or downwards. While not shown in FIG. 5A-H, it is not excluded that two oven units 110 and two LPCVD reactors 120 are positioned on top of each other, so as to enlarge the capacity of the system. In such as configuration, gas supply and gas removal means may again be coupled and/or shared. The (un)loading chambers 150, 160 could be provided with heating means, so as to carry out a pre-heating step. However, this is not deemed essential.

FIG. 5A shows a first stage of a process for running the said apparatus, wherein a first wafer boat 7 and a second wafer boat 17 are loaded onto a first paddle 80.

FIG. 5B shows a second stage, wherein the door 112 is opened and the paddle 80 is moved into the oven 110. This process is suitably carried out in a manner corresponding to the loading of a conventional oven system as commercially available. After unloading the first wafer boat 7 from the first paddle 80, the first paddle 80 returns again into the loading chamber 150. The door 112 is thereafter closed.

Figure 5C:
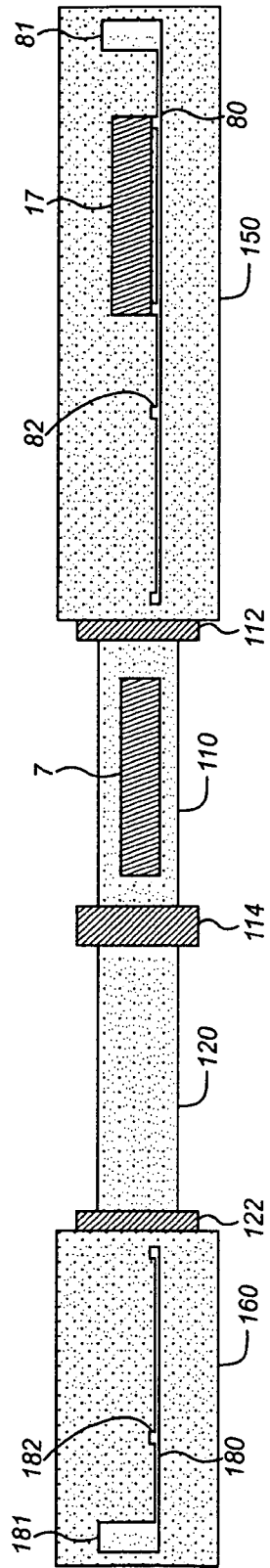

FIG. 5C shows a third stage, in which the substrates—or wafers—on the first wafer boat 7 are treated in the oven 110. The oven 110 is then heated in a manner known per se, particularly by controlled ramping up of temperatures. The temperature of the oven 110 for loading of wafer boats 7, 17 may however be higher than room temperature, for instance 700-800° C. Evidently, time is needed thereafter to bring the wafer boat and the wafers therein to said temperature before further ramping up the temperature. The process temperature for the oxidation step is suitably in the range of 850-1000° C.

Figure 5D:
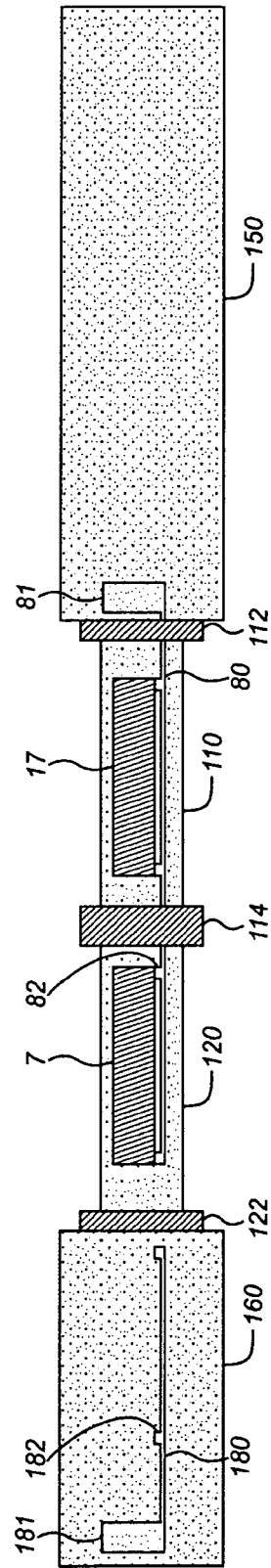

FIG. 5D shows a fourth stage, in which the first paddle 80 again is used so as to transfer the first wafer boat 7 from the oven 110 to the LPCVD reactor 120, and to transfer the second wafer boat 17 from the loading chamber into the oven 110. Thereto, door 112 and sluice 114 will be opened. The sluice is for instance embodied in the form of a panel.

Before opening the panel, the pressures in the oven 110 and the LPCVD reactor 120 are suitably brought to the same level, and the temperature in the oven 110 is brought down to the loading temperature of 700-800° C. After this equalization of conditions, the panel is opened and the wafer boat 7 is transferred from the oven 110 to the LPCVD reactor 120. Alternatively, the sluice 114 may be embodied in the form of a chamber for the wafer boat 7. The chamber may be put on the same temperature of either the LPCVD reactor 120 or the oven 110, and a temperature system for such chamber could be integrated with one of those. This chamber implementation has the benefit of constituting an isolation between the LPCVD reactor 120 and the oven 110. Moreover, such as chamber may be narrow, so as to leave room in oven 110 and/or the LPCVD reactor 120 for entry and/or removal of gases. In such as case, the first paddle 80 could bring the first wafer boat 7 into said chamber, while the second paddle 180 transfers the wafer boat 7 from the chamber into the LPCVD reactor 120.

In any case, it is a major advantage of the present system, that the wafers in the first wafer boat 17 are directly transferred to the LPCVD reactor 120 without an intermediate cooling down to room temperature. This reduces processing time. Moreover, the inventors of the present invention believe that such direct transfer at elevated temperature, for instance in the range of 600-900° C., more preferably from 700-800° C., reduces the hydrogen loss. Such hydrogen loss from the passivation layer is a reason for carrying out a separate forming gas anneal. Furthermore, the hydrogen content may be increased herein, by adding hydrogen into the gas composition of the LPCVD reactor. Even more preferably, the hydrogen content is increased in the LPCVD reactor 120, and possibly also the oven 110, for instance up to 50% or even up to 100% during the transfer of the wafer boat 7 from the oven 110 into the LPCVD reactor 120, for instance via a intermediate stay in the chamber of the sluice 114.

Figure 5E:
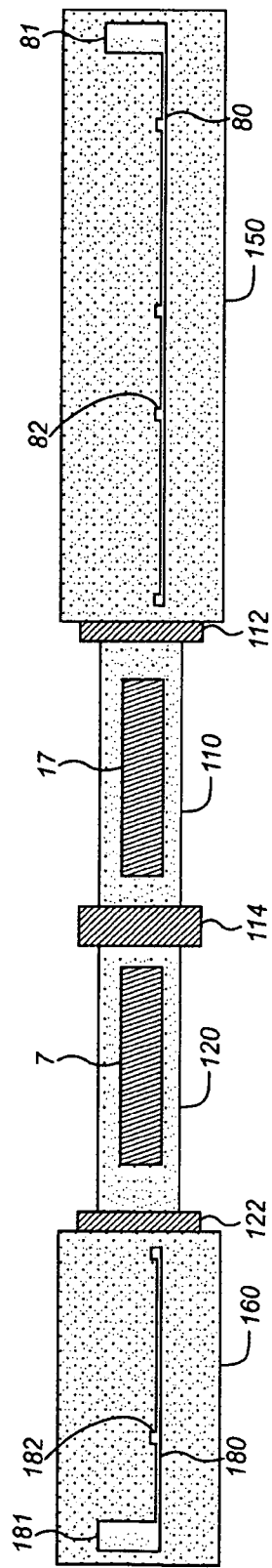

FIG. 5E shows a fifth stage, in which the first wafer boat 7 is processed in the LPCVD reactor 120 and the second wafer boat 17 is processed in the oven 110. Simultaneously, the first paddle 80 could be reloaded with a further wafer boat—not shown—, in the position of the second wafer boat 17. The advantage hereof is that the overall production yield may be increased, in that no further loading time is needed.

Figure 5F:
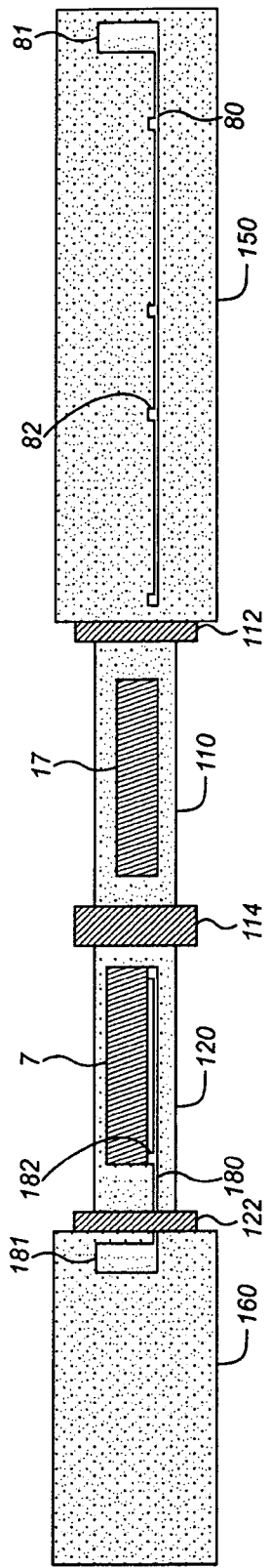

FIG. 5F shows a sixth stage, in which the first wafer boat 7 is removed from the LPCVD reactor 120 by means of the second paddle 180. It is an advantage of this removal by means of the second paddle 180, that the processing time in the oven may be longer than in the LPCVD reactor 120.

FIG. 5G shows a seventh stage, in which the first wafer boat 7 is in the unloading chamber 160, whereas the second wafer boat 17 is still in the oven 110.

FIG. 5H shows a subsequent stage, wherein the second wafer boat 17 is transferred to the LPCVD reactor 120. Suitably, this allows the simultaneous loading of a further wafer boat into the oven 110.

FIG. 6 shows a diagrammatical top view of the apparatus. In this embodiment, the apparatus is provided with back mounted gas systems 119, 129. Such backmounted arrangement of gas systems is particularly advantageous for LPCVD, since it results in additional space for bubblers and other services for LPCVD. Moreover, it provides short lines from the gas system 129 to a flange of the LPCVD reactor 120. Needed gas systems are known per se to the skilled person. Furthermore, a gas source cabinet 190 is provided and is arranged before the sluice 114 of the apparatus. An alternative arrangement is however not excluded. The gas source cabinet 190 suitably contains all process gas facilities as well as a digital process controller and peripheral equipment. Gas panels are suitably mounted vertically for ease maintenance. The gas cabinet may be exhausted through the full height thereof.

FIG. 7 shows a diagrammatical cross-sectional view of a second embodiment of the apparatus. This apparatus is further provided with a dry etching-tool 130, which is provided with a door 132 for loading and unloading into the loading chamber 150. As shown in this implementation, the dry etching tool 130 is a full-tube system so that a plurality of wafer boats may be subjected to dry etching simultaneously. The loaded wafer boats may be transported, particularly by means of an elevator, to the first paddle 80 after the dry etch operation. If desired, further storage and handling space may be available for storage and handling of a series of wafer boats from the dry etching tool 130 into a row from entry into the oven 110.

It will be apparent to the person skilled in the art that other embodiments of the invention can be conceived and reduced to practice without departing from the true spirit of the invention, the scope of the invention being limited only by the appended claims. The description illustrates the invention and is not intended to limit the invention.

The invention claimed is:

1. A method for manufacturing a solar cell from a semiconductor substrate of a first conductivity type, the semiconductor substrate having a front side and a back side, the method comprising in a sequence:
    exposing the semiconductor substrate to a dopant of a second conductivity type under conditions sufficient to create, by diffusion, a second conductivity-type doped layer in the front side and the back side, and
    form a dopant containing glassy layer on the front and back side;
    removing the second conductivity-type doped layer and the dopant containing glassy layer from the back side by a single sided etching process, while maintaining the dopant containing glassy layer on the front side; then
    creating a Back Surface Field (BSF) layer of the first conductivity type on the back side by implanting a dopant of the first conductivity type into the back side using directional ion beams;
    removing the dopant containing glassy layer from the front side of said substrate by an etching process, and
    heating said substrate, after removing the dopant containing glassy layer from the front side, for a predetermined period of time and to a predetermined temperature in oxidizing atmosphere to form, by surface oxidation, passivation layers on the front and the back side,
    wherein the dopant containing glassy layer on the front side is used as a protective carrier during the implant of the dopant of the first conductivity type into the back side.

2. The method as claimed in claim 1, wherein the single sided etching process on the back side comprises over etching without negatively affecting solar cell efficiency.

3. The method as claimed in claim 1, wherein the heating in the oxidizing atmosphere is carried out so as to obtain a deep junction in the semiconductor substrate adjacent to the front side.

4. The method as claimed in claim 3, wherein the deep junction has a junction depth in the range of 0.4-1 micrometer.

5. The method as claimed in claim 3, wherein the deep junction is a buried emitter.

6. The method as claimed in claim 5, wherein the buried emitter comprises boron.

7. The method as claimed in claim 3, wherein the deep junction is contacted with a metal paste diffusing into the semiconductor substrate or by means of any electroconductive deposition technique.

8. The method as claimed in claim 1, wherein the implantation is carried out for several substrates simultaneously.

9. The method as claimed in claim 1, wherein the implantation step is carried out with phosphorus ions.

10. The method as claimed in claim 1, wherein use is made of a type of implantation apparatus known as a High Current implanter.

11. The method as claimed in claim 1, wherein several substrates are provided after their processing in an oven for the diffusion step onto a holding device, which merely makes contacts to the protective carrier on the front side of the substrates.

12. The method as claimed in claim 11, wherein the holding device is moved to subsequent tools for removal of the dopant containing glassy layer from the back side and for the implantation of dopant ions at the back side.

13. The method as claimed in claim 1, further comprising forming a layer of silicon nitride on the front and back side using plasma-enhanced chemical vapor deposition (PECVD) or low pressure chemical vapour deposition (LPCVD).

14. The method as claimed in claim 13, wherein the layer of silicon nitride is formed simultaneously on the front and back sides.

15. The method as claimed in claim 13, wherein the layer of silicon nitride is formed over the passivation layers on the front side and the back side.

16. The method as claimed in claim 1, wherein the etching process for removing the dopant containing glassy layer on the front side comprises a dry hydrogen fluoride (HF) vapor process.

17. The method as claimed in claim 16 which method comprises:
   positioning the substrate in a carrier;
   retaining the substrate in the carrier during the subsequent process steps for: removing the dopant containing glassy layer on the front side by a dry hydrogen fluoride (HF) vapor process; surface oxidation by heating said substrate for a predetermined period of time and to a predetermined temperature in oxidizing atmosphere to form passivation layers on the front and the back side; and forming respective layers of silicon nitride on the front side and the back side using LPCVD.

18. The method as claimed in claim 1, wherein the emitter has a high sheet resistance within a range of 60-150 $\Omega$/sq.

19. The method as claimed in claim 1, wherein the implanting is performed at a dose in the range of $10^{15}$-$10^{16}$ ions/cm$^2$.

20. The method as claimed in claim 1, wherein the passivation layers are formed on the second conductivity-type doped layer in the front side and/or on the BSF layer on the back side.

* * * * *